(12) United States Patent
Cachia (10) Patent No.: US 9,200,854 B2
(45) Date of Patent: Dec. 1, 2015

(54) PLATE

(71) Applicant: Control Techniques Limited, Newtown (GB)

(72) Inventor: Charles Anthony Cachia, Welshpool (GB)

(73) Assignee: CONTROL TECHNIQUES LIMITED, Newtown (GB)

( * ) Notice: Subject to any disclaimer, the term of this patent is extended or adjusted under 35 U.S.C. 154(b) by 287 days.

(21) Appl. No.: 13/886,550

(22) Filed: May 3, 2013

(65) Prior Publication Data

US 2013/0306281 A1   Nov. 21, 2013

(30) Foreign Application Priority Data

May 4, 2012 (GB) .................................. 1207891.1

(51) Int. Cl.
| | |
|---|---|
| H05K 7/20 | (2006.01) |
| G06F 1/20 | (2006.01) |
| H01L 23/34 | (2006.01) |
| F28F 3/00 | (2006.01) |
| F28D 21/00 | (2006.01) |
| F28D 1/02 | (2006.01) |

(52) U.S. Cl.
CPC ... *F28F 3/00* (2013.01); *G06F 1/20* (2013.01); *H01L 23/34* (2013.01); *H05K 7/20* (2013.01); *F28D 1/024* (2013.01); *F28D 2021/0029* (2013.01)

(58) Field of Classification Search
CPC .......... H05K 7/20; H05K 7/2039; G06F 1/20; H01L 23/467; H01L 21/4871
USPC ........ 361/679.46–679.54, 690–697, 361/715–724; 165/80.2, 80.3, 104.33, 165/121–126, 185; 454/177, 178, 184, 454/213.1, 214.1; 714/16.1, 16.3, 15.1
See application file for complete search history.

(56) References Cited

U.S. PATENT DOCUMENTS

| | | | |
|---|---|---|---|
| 5,936,836 A | 8/1999 | Scholder | |
| 5,940,269 A * | 8/1999 | Ko et al. | 361/697 |
| 6,657,860 B2 * | 12/2003 | Matsui et al. | 361/695 |
| 6,681,845 B1 * | 1/2004 | Yeh et al. | 165/122 |
| 6,711,015 B2 | 3/2004 | Syring et al. | |
| 7,447,027 B2 | 11/2008 | Xia et al. | |
| 7,447,028 B2 | 11/2008 | Lai et al. | |
| 7,466,547 B2 * | 12/2008 | Holmes et al. | 361/695 |
| 7,492,590 B2 | 2/2009 | Chen et al. | |
| 7,495,912 B2 | 2/2009 | Long et al. | |
| 7,697,288 B2 * | 4/2010 | Okutsu | 361/695 |
| 7,742,295 B2 * | 6/2010 | Hata et al. | 361/679.47 |
| 8,029,169 B2 | 10/2011 | Liu | |
| 2002/0044424 A1 * | 4/2002 | Hashimoto et al. | 361/709 |
| 2008/0253083 A1 * | 10/2008 | Okutsu | 361/687 |
| 2010/0165573 A1 * | 7/2010 | Fang | 361/697 |

FOREIGN PATENT DOCUMENTS

JP   4-56155   2/1992

* cited by examiner

*Primary Examiner* — Michail V Datskovskiy
(74) *Attorney, Agent, or Firm* — Harness, Dickey & Pierce, P.L.C.

(57) ABSTRACT

The present disclosure relates to a plate for use with a heatsink. The plate is adapted to engage with the heatsink and a fan subassembly, and comprises a first substantially planar section which is adapted to engage with the heatsink and a second substantially planar section which is adapted to engage with the fan subassembly.

20 Claims, 7 Drawing Sheets

PLATE

CROSS-REFERENCE TO RELATED APPLICATION

This application claims the benefit and priority of Great Britain Patent Application No. 1207891.1 filed May 4, 2012. The entire disclosure of the above application is incorporated herein by reference.

FIELD

The present invention relates to a plate for use with a heatsink.

BACKGROUND INFORMATION

Electrical devices generate heat during functioning. It is important to ensure that such devices are cooled since overheating can cause the device to malfunction. The term "heatsink" is generally used to describe any component or apparatus that cools a device by transferring heat generated within a solid device to a fluid such as a liquid or air by convection. Heatsinks are used in refrigeration and air conditioning systems as well as for cooling a range of electronic and optoelectronic devices including computer central processing units (CPU's) and other processors. They are designed to increase the surface area in contact with the surrounding fluid and therefore generally include a large number of protrusions known as fins. Various types of heatsinks are known, such as pin fin heatsinks and straight fin heatsinks. Heatsinks are typically used in conjunction with a fan.

A finned heatsink offers limited efficiency if the ends of the fins are not enclosed, because air can escape from the fins rather than travelling the length of the heatsink. There is therefore a need in the art for a way of improving the efficiency of heatsinks such as finned heatsinks.

SUMMARY OF THE INVENTION

The present inventor has devised a plate for use with a heatsink which not only improves the efficiency of the heatsink but also provides location and support for the heatsink to permit easy assembly of a device comprising the heatsink and also holds a fan associated with the heatsink in place within the device.

Accordingly, in an aspect the present invention provides a plate adapted to engage with a heatsink and a fan subassembly. The plate comprises a first substantially planar section which is adapted to engage with a heatsink and a second substantially planar section which is adapted to engage with a fan subassembly.

BRIEF DESCRIPTION OF THE DRAWINGS

Embodiments will now be described, by way of example, with reference to the accompanying drawings in which:

FIG. 5 is a cross-section showing the chassis the right way up (i.e. in position ready for use), wherein a plate in accordance with an embodiment of the invention is supporting a heatsink and a fan subassembly. FIG. 5 also shows the heatsink being screwed into the chassis.

OVERVIEW

In overview, the present invention provides a plate for use with a heatsink. The plate covers the ends of the fins of the heatsink to ensure that air cannot escape from the fins and directs airflow from a fan onto the heatsink. The plate can therefore be referred to as a baffle plate. The plate also has various features which allow it to provide location and support for the heatsink to permit easy assembly of a device comprising the heatsink. The plate also holds a fan associated with the heatsink in place within the device.

The plate of the invention is adapted to be detachably coupled to a device which comprises at least a heatsink and a fan. Typically, the plate is coupled to the device by means of a rotatable fastening, which allows the plate to be rotated into its final position on the device. Once the plate is in its final position, it can be locked into position if desired.

As described herein, the plate of the invention also acts as an assembly jig for assembly of the heatsink and fan within the device. In this aspect of the invention, the plate holds the heatsink and fan in position which allows them to be screwed into position on the chassis of the device.

The dimensions of the plate will largely be dictated by the physical size and shape of the device comprising a heatsink and a fan, with which the plate is to be used. The dimensions of the plate will therefore be suitable to allow the plate to interact and support the heatsink and fan subassembly of the device.

DETAILED DESCRIPTION OF THE INVENTION

The plate disclosed herein can be better understood with respect to the Figures.

Figure 1A:
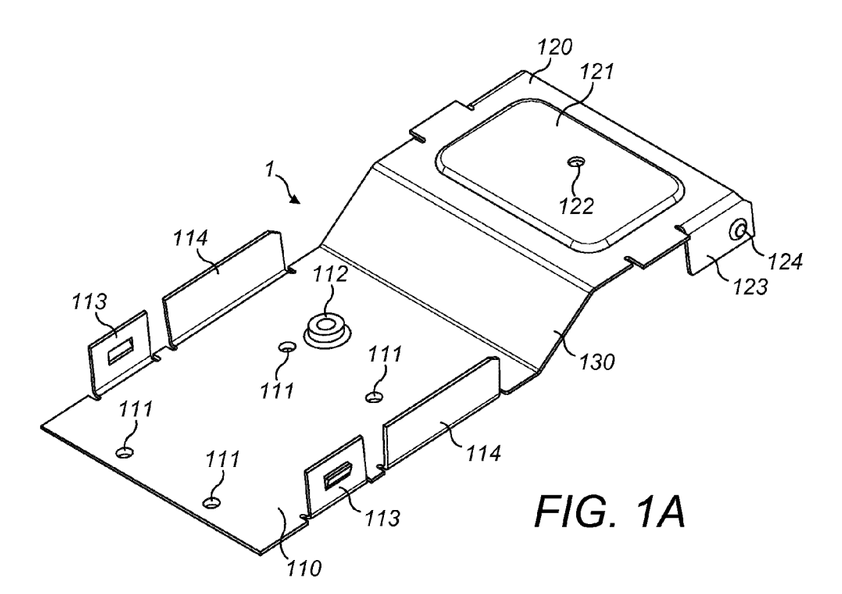
FIG. 1A illustrates an isometric view of a plate in accordance with an embodiment of the invention.
Figure 1B:
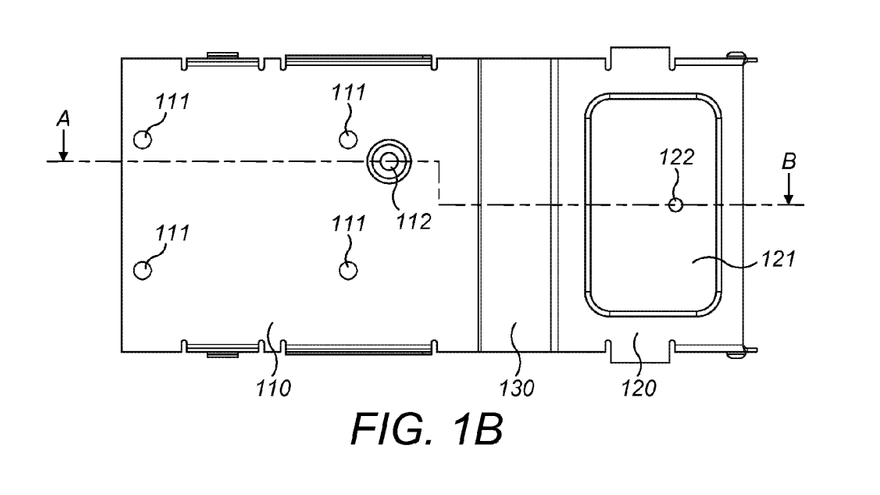
FIG. 1B illustrates a bottom view of the plate of FIG. 1A.
Figure 1C:
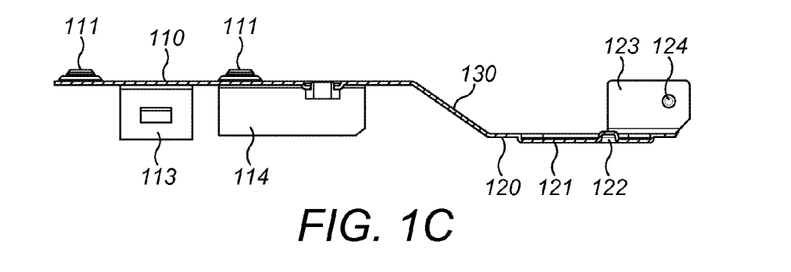
FIG. 1C illustrates the section from points A-B shown in FIG. 1B. It can be seen that in FIG. 1C the plate has been rotated by 180° such that it is in the "upside down" position compared to FIG. 1A.

Different views of a plate in accordance with one embodiment of the invention are shown in FIGS. 1A, 1B and 1C. A plate 1 in accordance with the invention has a first substantially planar section 110 and a second substantially planar section 120. By "substantially planar section" is meant a section of the plate wherein the majority of the section has a flat, two-dimensional structure. The plate 1 can also comprise a third substantially planar section 130 which connects the first substantially planar section 110 and the second substantially planar section 120. The third substantially planar section 130, when present, is typically integral with the first substantially planar section 110 and the second substantially planar section 120. The third substantially planar section 130 is typically in the form of a ramp (i.e. is at an angle with respect to the first substantially planar section 110 and the second substantially planar section 120) such that it causes the first substantially planar section 110 and the second substantially planar section 120 to be at different elevations. The first substantially planar section 110 and the second substantially planar section 120 are typically substantially parallel to each other.

Figure 6:
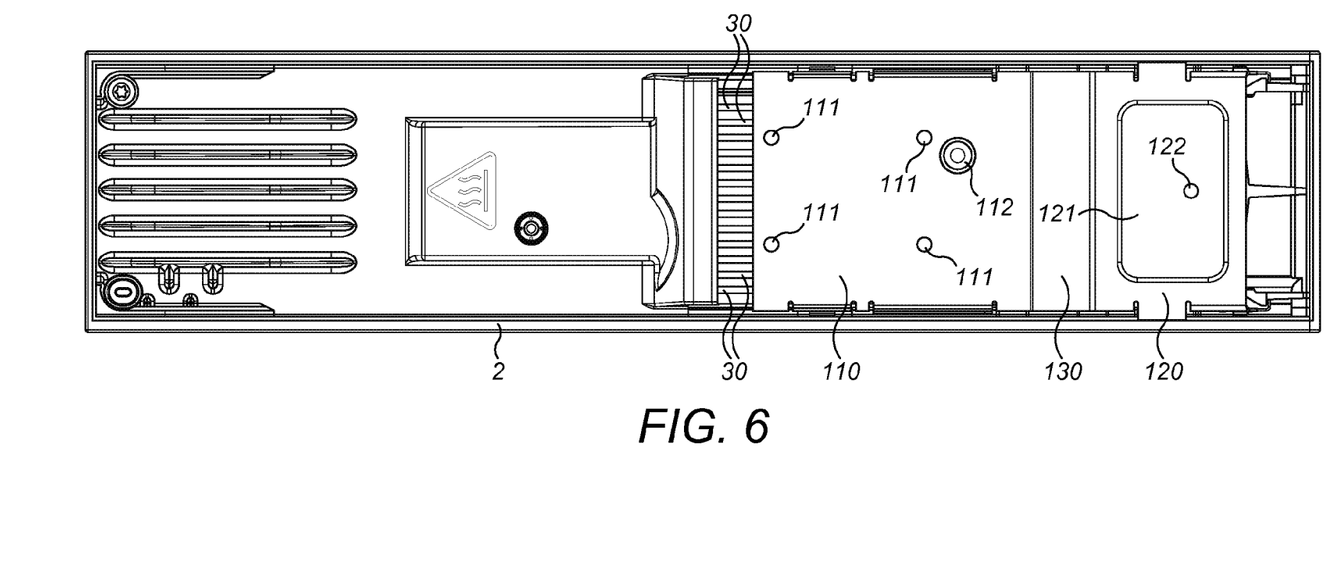
FIG. 6 is a bottom view of a device showing the plate in accordance with an embodiment of the invention in its final position after assembly into the device. The bottom of the plate can be seen in FIG. 6. This view of the plate is the same as in FIG. 1B.

The first substantially planar section 110 typically has at least one protrusion 111. In some embodiments, the first substantially planar section 110 has two, three or four protrusions 111. The plate shown in FIG. 1 has four protrusions 111. The protrusions 111 protrude from the underside of the first substantially planar section 110. The protrusions 111 are adapted to engage with the heatsink 3 and can be positioned in any suitable formation. For example, if there are three protrusions 111 they can be positioned in the form of a triangle or if there are four protrusions 111 they can be positioned in the form of a square or rectangle. However, the protrusions 111 will typically be positioned such that they engage the heatsink 3 between the fins 30, as shown in FIG. 6. This is so that when the plate 1 is locked into position, the heatsink does not move sideways while the chassis is being turned from the upside down position to the right way up position. It is important that the heatsink does not move and stays in its position in the chassis.

In one embodiment, the protrusions 111 are made out of the same material as and are integral with the first substantially planar section 110. Alternatively, the protrusions 111 are made out of different material from the first substantially planar section 110.

The second substantially planar section 120 typically has at least one protrusion 122. In some embodiments, the second substantially planar section 120 has one protrusion 122 or two, three or four protrusions 122. The plate 1 shown in FIG. 1 has a single protrusion 122. The protrusions 122 protrude from the underside of the second substantially planar section 120. The protrusions 122 therefore project in the same direction as the protrusions 111 of the first substantially planar section 110. The protrusions 122 are adapted to engage with the fan subassembly 4 and can be positioned in any suitable formation. For example, if there are three protrusions 122 they can be positioned in the form of a triangle or if there are four protrusions 122 they can be positioned in the form of a square or rectangle. In one embodiment, the protrusions 122 are made out of the same material as and are integral with the second substantially planar section 120. Alternatively, the protrusion or protrusions 122 are made out of different material from the second substantially planar section 120.

In one embodiment, the second substantially planar section 120 has a raised section 121 which is itself substantially planar. The protrusion(s) 122 can be present in the raised section 121 or in the non-raised section of the second substantially planar section 120. The raised section can be used to provide a contact between the plate 1 and part of the device for earthing and EMC purposes. For example, FIG. 6 shows the bottom of a device with a plate 1 in accordance with an embodiment of the invention in its final position. It can be seen from FIG. 6 that when the device is mounted onto a surface, the raised section 121 of the plate 1 will make contact with the surface onto which it is mounted. The raised section 121 will typically be the only feature of the plate 1 with a surface area large enough to make proper contact with such a surface for EMC purposes. Other features of the plate 1 can be used for EMC purposes, for example the flanges 114 described below.

The plate 1 is adapted to engage with a heatsink 3 and a fan subassembly 4. The heatsink and fan subassembly are typically part of a device and the plate 1 can be attached to the device using any suitable means and at any suitable location. In one embodiment, the plate has two flanges 123 which extend downwards from the underside of the plate which allow the plate to engage with the device. The flanges 123 are typically substantially perpendicular to the plate 1. In one embodiment, each flange 123 has a protrusion 124 and the protrusions 124 are used to attach the plate 1 to the device by a snap fit fixing. In this embodiment, the device of which the heatsink 3 and the fan subassembly 4 form a part has a component 200 (as shown in FIG. 2B) which mates with the protrusion 124. In this manner, the plate 1 attaches to the device such that the plate can be rotated into position on the device. The plate can optionally be locked into this position. In this embodiment, the flanges 123 are located at one end of the plate 1, either the distal or the proximal end, on the side of the plate 1. In the embodiment shown in FIG. 1, the flanges 123 project from the second substantially planar section 120 and are therefore at the distal end of the plate 1.

The plate can also have one or more further features which provide attachment points with other components of the device assembly. For example, the plate may have one or more flanges, for example one or more pairs of flanges, projecting upwards or downwards. In one embodiment, the plate has a pair of flanges with clips, for example the flanges 113 shown in FIG. 1, which allow the plate to be attached to another component of the device. In another embodiment, the plate may have one or more further features such as the hollow cylindrical protrusion 112 shown in FIG. 1 which allows the plate to be attached to a further component by means of a screw. Such features can be present in either the first or second substantially planar section of the plate.

The plate can also have one or more further features which provide contact points with other components of the device assembly, for example for EMC purposes. For example, the plate may have one or more further flanges, for example one or more pairs of flanges, projecting upwards or downwards for this purpose. An example of such a feature is the pair of flanges 114 shown in FIG. 1 which make contact between the plate 1 and the inner walls of the chassis 2 of the device for EMC purposes. The pair of flanges 114 also allow the chassis 2 to be connected to a mounting panel if desired.

The plate 1 can be fabricated from any suitable material or combination of materials. However, the material(s) should offer good conductivity and is therefore typically a metal. For example, the plate 1 can comprise steel, aluminium, copper or other ferrous or non-ferrous metals. The plate 1 can optionally be coated with a further material, for example another metal such as iron or zinc. The coating can be applied using any suitable technique, for example electroplating.

As described herein, the principle function of the plate of the invention is to ensure that air cannot escape from the fins and to direct airflow from a fan onto the heatsink. In view of this baffling function, the surface of the plate of the invention, at least on the underside which contacts the heatsink and the fan subassembly, should be substantially smooth. The surface should preferably not have any scratches or patterns on its surface or be grainy.

The plate of the invention is adapted for use with a heatsink and a fan subassembly. The heatsink is typically a finned heatsink which has a plurality of fins projecting outwardly from a base. Such a finned heatsink is shown from above in FIG. 2A and can also be seen in FIG. 6. By "fan subassembly" is meant a fan and associated components holding the fan together. It can be seen that a plate for use as described herein would not be of use if it contacts the fan directly; rather the plate of the invention supports the fan subassembly which holds the fan. The heatsink and the fan subassembly are typically located within a chassis, as shown in the Figures herein. The chassis is typically formed of a metal such as aluminium.

The present invention provides a plate for use in a device comprising a heatsink, which plate is multifunctional in that it both improves the efficiency of the heatsink and acts as an assembly jig during assembly of the device. The plate of the invention therefore has the advantages that it improves the speed of assembly and reduces the component count of the finished device, thus decreasing costs. The plate also acts as a conductor for EMC purposes between the chassis and the panel onto which the device is mounted.

A specific example of a plate in accordance with one embodiment of the invention will now be described with reference to the Figures.

Referring to FIG. 1A, a plate 1 has a first substantially planar section 110 at its proximal end and a second substantially planar section 120 at its distal end. The plate 1 also has a third substantially planar section 130 which is integral with and connects the first substantially planar section 110 and the second substantially planar section 120. The third substantially planar section 130 joins the distal end of the first substantially planar section 110 and the proximal end of the second substantially planar section 120. The third substantially planar section 130 is in the form of a ramp and therefore causes the first substantially planar section 110 and the second substantially planar section 120 to be at different elevations but substantially parallel to each other.

Referring to FIG. 1A, the first substantially planar section 110 has four protrusions 111 (or "pips") which protrude downwards from the underside of the first substantially planar section 110 and are spaced in a rectangular formation. The first substantially planar section 110 also has a hollow cylindrical protrusion 112 which protrudes upwards from the first substantially planar section (in the opposite direction from the four protrusions 111) and is larger than the four protrusions 111. The protrusion 112 allows the plate to be attached to a further component by means of a screw. The first substantially planar section 110 also has four flanges extending upwards from its sides. There are two flanges 113 which have barb-like clips and are adapted to engage with the main frame of the device and two flanges 114 which make contact with the chassis for EMC purposes. All of the flanges 113 and 114 are substantially perpendicular to the first substantially planar section 110.

Still referring to FIG. 1A, the second substantially planar section 120 has a raised section 121, which has a single protrusion 122. The second substantially planar section 120 also has two flanges 123 which are substantially perpendicular to the second substantially planar section 120 and extend downwards from its sides at the distal end of the plate 1. The flanges 123 extend in the opposite direction to the flanges 113 and 114. The flanges 123 each have a protrusion 124 which are used to attach the plate 1 to the device by a snap fit fixing.

Referring to FIG. 1B, which is a bottom view of the plate of FIG. 1A, the protrusions 111 are in a rectangular formation on the underside of the first substantially planar section 110.

Referring to FIG. 1C, which is a section from points A-B shown in FIG. 1B and which portrays the plate 1 rotated by 180° and in the upside down position, two of the protrusions 111 can be seen.

Figure 2A:
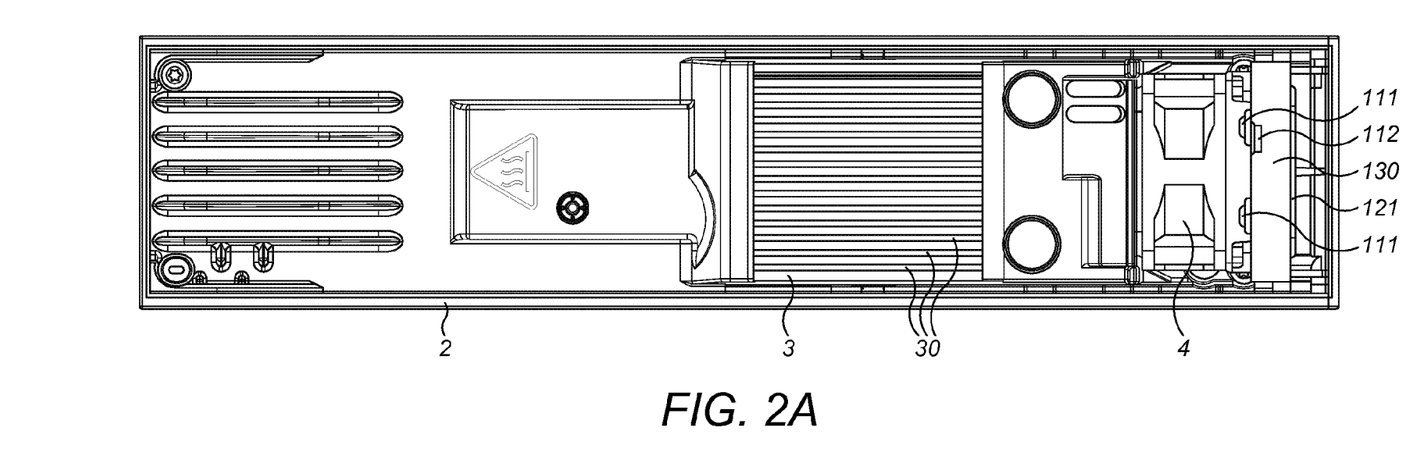
FIG. 2A is a bottom view of a device with a plate in accordance with an embodiment of the invention coupled thereto. The device in FIG. 2A is in the upside down position compared to its position when in use.
Figure 2B:
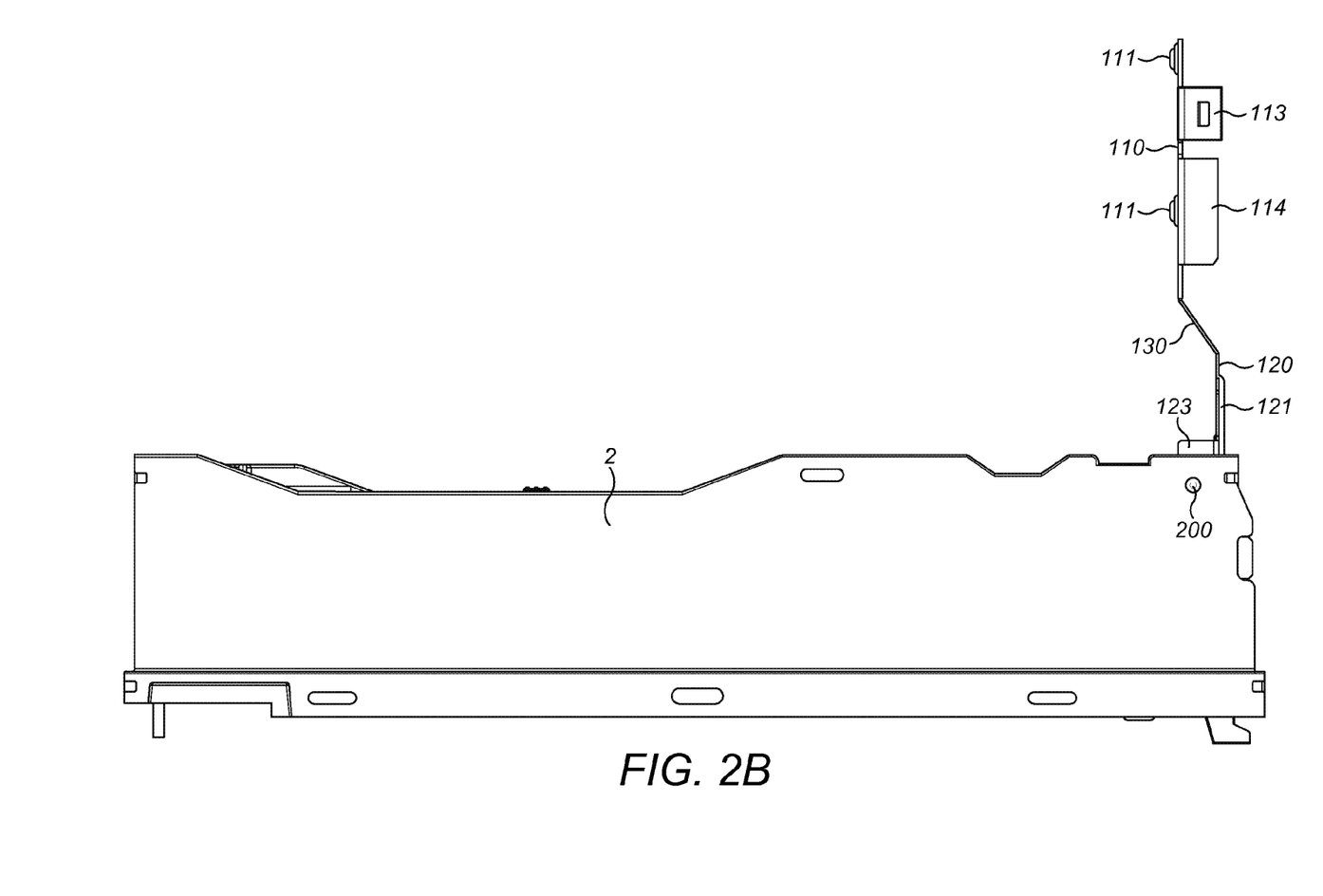
FIG. 2B is a side view of the same device with a plate in accordance with an embodiment of the invention coupled thereto, prior to the plate being moved into its final position.
Figure 3:
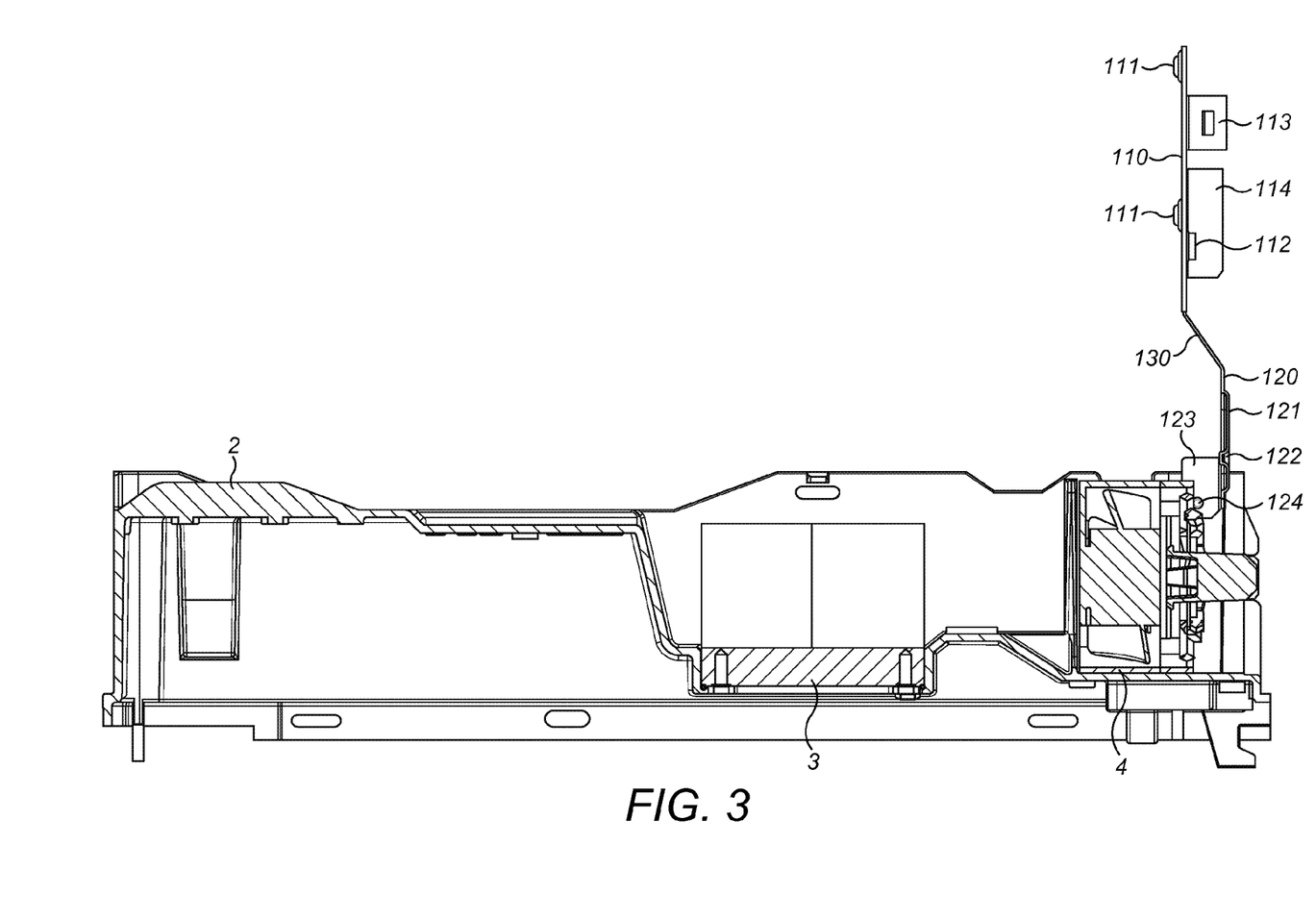
FIG. 3 is a cross-section of the device shown in FIG. 2B, showing the chassis of the device in the upside down position and a plate in accordance with an embodiment of the invention coupled to the chassis.

Referring to FIG. 2A, which is a bottom view of a device with a plate in accordance with an embodiment of the invention coupled thereto in its initial position, the end view of the plate can be seen. In particular, two of the protrusions 111 can be seen, as well as the protrusion 112, the third substantially planar section 130 and the raised section 121 of the second substantially planar section. FIG. 2A also shows the chassis 2 of the device and the heatsink 3 and the fan assembly 4. The fins 30 of the heatsink can also be seen in FIG. 3A.

Referring to FIG. 2B, which is a side view of the same device as FIG. 2A, the main feature that can be seen is the chassis 2 of the device. The plate 1 is coupled to the chassis 2 of the device by means of the protrusions 124 (not seen in FIG. 2B), which snap fit with a corresponding feature 200 on the device.

Referring to FIG. 3, the plate 1 is coupled to a chassis 2. FIG. 2 also shows a heatsink 3 and a fan subassembly 4, which have been lowered into the chassis 2 and are now resting on the chassis 2.

Figure 4:
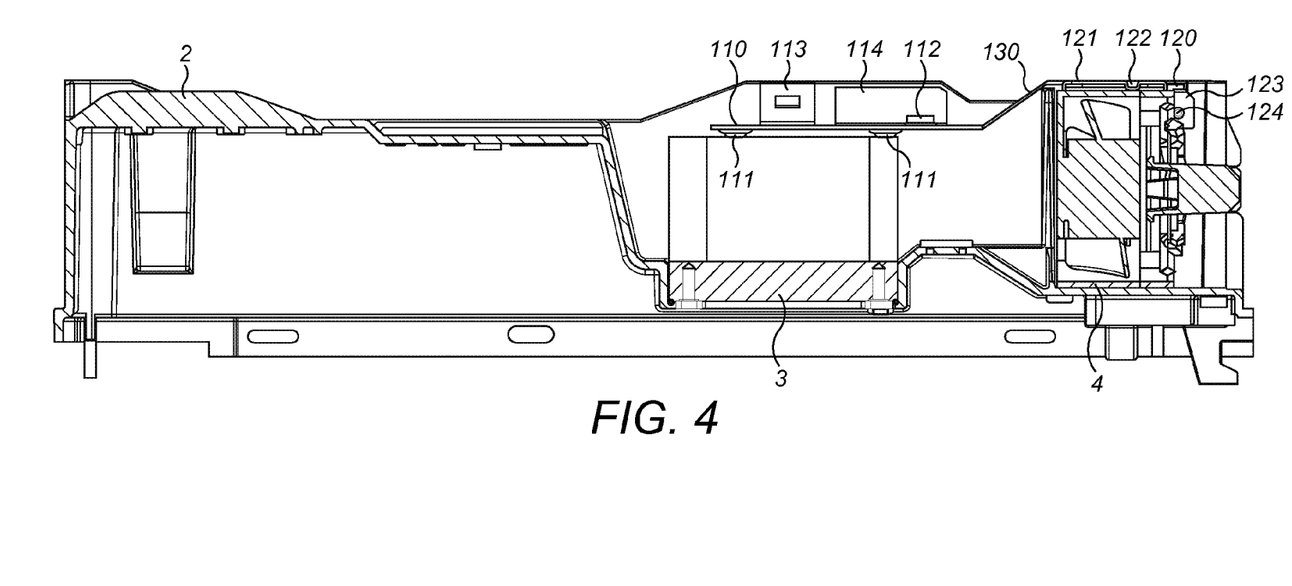
FIG. 4 is a cross-section showing the chassis in the upside down position as in FIG. 3, wherein a plate in accordance with an embodiment of the invention has been rotated into position on the chassis.

Referring to FIG. 4, the plate 1 is rotated into position such that it engages the heatsink 3 and the fan subassembly 4, which are both resting on the chassis 2. The plate 1 can be locked into this position. The chassis 2 is still in the upside down position in FIG. 4. The plate 1 pushes down on the heatsink 3 by means of the protrusions 111. The plate 1 also pushes down on the fan subassembly 4 by means of the protrusion 122 in the raised portion 121 of the second substantially planar section 120.

Figure 5:
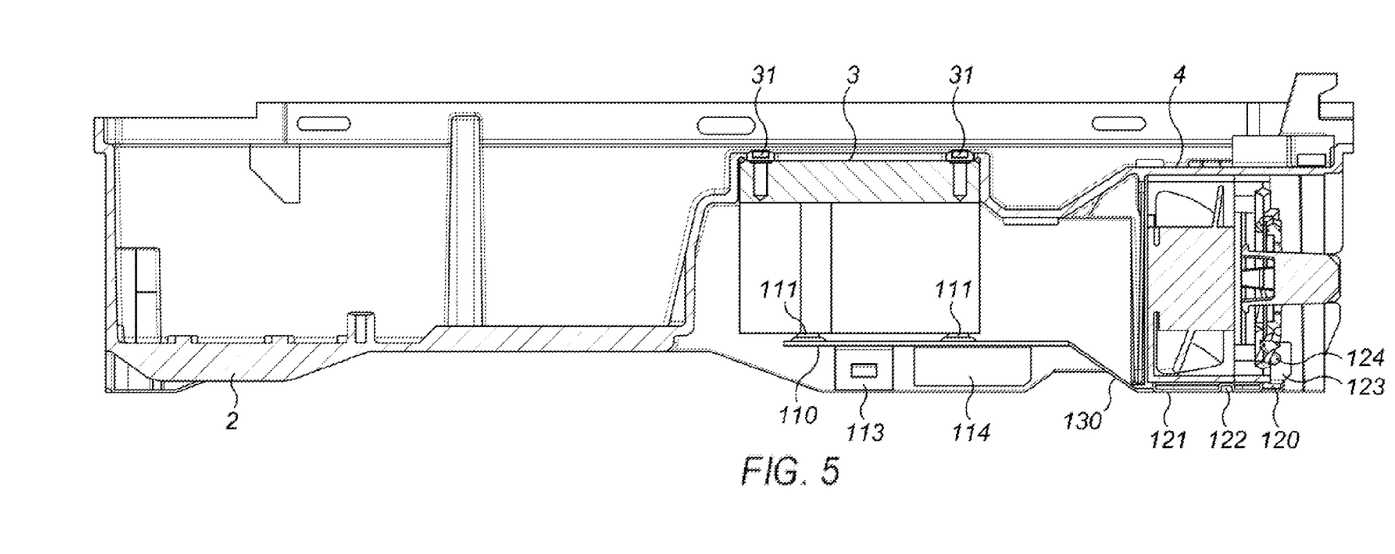

Referring to FIG. 5, the chassis 2 is shown in the right way up position. In this position, the plate 1 acts as an assembly jig. The plate 1 supports both the heatsink 3 and the fan subassembly 4. The plate 1 supports the heatsink 3 by means of the protrusions 111. The plate 1 supports the fan subassembly 4 by means of the protrusion 122 in the raised portion 121 of the second substantially planar section 120. The use of the plate 1 as an assembly jig allows the heatsink 3 to be attached to the chassis 2 by means of a plurality of screws 31.

Referring to FIG. 6, which is a bottom view of a device with a plate in accordance with an embodiment of the invention in its final position after assembly into the device, the bottom of the plate can be seen. This view of the plate is the same as in FIG. 1B. It can be seen from FIG. 6 that the protrusions 111 engage the heatsink 3 between the fins 30.

The dimensions of the plate and device illustrated in the Figures are exemplary only. It will be appreciated that the dimensions and materials of the plate of the invention can be varied as desired.

The invention claimed is:

1. A plate adapted to engage with a heatsink and a fan subassembly, comprising a first substantially planar section which is adapted to engage with a heatsink and a second substantially planar section which is adapted to engage with a fan subassembly, the second substantially planar section having a raised portion adapted to engage with a device comprising said heatsink and said fan subassembly.

2. A plate according to claim 1, further comprising a third substantially planar section which connects said first substantially planar section and said second substantially planar section.

3. A plate according to claim 2, wherein said third substantially planar section is at an angle such that said first substantially planar section and said second substantially planar section are substantially parallel to each other.

4. A plate according to claim 1, wherein said first substantially planar section comprises a plurality of protrusions adapted to engage with said heatsink.

5. A plate according to claim 1, wherein said second substantially planar section has at least one protrusion adapted to engage with said fan subassembly.

6. A plate according to claim 1, further comprising an attachment component for detachably coupling said plate to the device comprising said heatsink and said fan subassembly.

7. A plate according to claim 6, wherein said attachment component is a plurality of projections that mate with a feature of said device.

8. A plate adapted to engage with a heatsink and a fan subassembly, comprising a first substantially planar section which is adapted to engage with a heatsink and a second substantially planar section which is adapted to engage with a fan subassembly, the first substantially planar section comprising a plurality of protrusions adapted to engage with said heatsink.

9. A plate according to claim 8, further comprising an attachment component for detachably coupling said plate to a device comprising said heatsink and said fan subassembly.

10. A plate according to claim 9, wherein said attachment component is a plurality of projections that mate with a feature of said device.

11. A plate according to claim 8, further comprising a third substantially planar section which connects said first substantially planar section and said second substantially planar section.

12. A plate according to claim 11, wherein said third substantially planar section is at an angle such that said first substantially planar section and said second substantially planar section are substantially parallel to each other.

13. A plate according to claim 8, wherein said second substantially planar section has a raised portion adapted to engage with a device comprising said heatsink and said fan subassembly.

14. A plate according to claim 13, further comprising a third substantially planar section which connects said first substantially planar section and said second substantially planar section, wherein said third substantially planar section is at an angle such that said first substantially planar section and said second substantially planar section are substantially parallel to each other.

15. A plate adapted to engage with a heatsink and a fan subassembly, comprising a first substantially planar section which is adapted to engage with a heatsink and a second substantially planar section which is adapted to engage with a fan subassembly, the second substantially planar section having at least one protrusion adapted to engage with said fan subassembly.

16. A plate according to claim 15, further comprising a third substantially planar section which connects said first substantially planar section and said second substantially planar section.

17. A plate according to claim 16, wherein said third substantially planar section is at an angle such that said first substantially planar section and said second substantially planar section are substantially parallel to each other.

18. A plate according to claim 17, wherein said second substantially planar section has a raised portion adapted to engage with a device comprising said fan subassembly.

19. A plate according to claim 15, further comprising an attachment component for detachably coupling said plate to a device comprising said fan subassembly.

20. A plate according to claim 19, wherein said attachment component is a plurality of projections that mate with a feature of said device.

* * * * *